United States Patent [19]
Stessens

[11] Patent Number: 5,402,429
[45] Date of Patent: Mar. 28, 1995

[54] ERROR DETECTION AND CORRECTION DEVICE TO DETECT AND CORRECT SINGLE BIT ERRORS IN A TRANSMITTED SEQUENCE OF BITS

[75] Inventor: Werner J. C. Stessens, Ginderbuiten, Belgium

[73] Assignee: Alcatel N.V., Amsterdam, Netherlands

[21] Appl. No.: 90,667

[22] Filed: Jul. 13, 1993

[30] Foreign Application Priority Data

Jul. 14, 1992 [EP] European Pat. Off. ........... 92202148

[51] Int. Cl.[6] .......................................... G06F 11/00
[52] U.S. Cl. .................... 371/37.1; 371/37.6
[58] Field of Search .................. 371/37.6, 37.1, 40.1, 371/53

[56] References Cited

U.S. PATENT DOCUMENTS

| | | | |
|---|---|---|---|
| 3,678,469 | 7/1972 | Freeman et al. | 371/37.1 |
| 4,105,999 | 8/1978 | Nakamura | 371/37.6 |
| 4,937,828 | 6/1990 | Shih et al. | 371/37.6 |
| 5,130,991 | 7/1992 | Takano | 371/37.6 |
| 5,230,002 | 7/1993 | Yamashita et al. | 371/37.1 |

FOREIGN PATENT DOCUMENTS

| | | |
|---|---|---|
| 0092960 | 11/1983 | European Pat. Off. . |
| 0230730 | 8/1987 | European Pat. Off. . |
| 0444661 | 9/1991 | European Pat. Off. . |
| 0477553 | 4/1992 | European Pat. Off. . |
| 0492812 | 7/1992 | European Pat. Off. . |
| 3841370 | 6/1989 | Germany . |

OTHER PUBLICATIONS

AN 92-032940 C05!, Derwent Publications Ltd., London, GB, Week 9205 and AU-D-7 704 291, Dec. 5, 1991 (Alcatel N.V.).
Patent Abstracts of Japan, vol. 16, No. 188 (E-1198) May 7, 1992 and JP-A-40 23 646 Jan. 28, 1992 (NIC Corp.).
Patent Abstracts of Japan, vol. 15, No. 284 (E-1091) Jul. 18, 1991 and JP-A-30 98 346 Apr. 23, 1991 (NTT Corp.).

*Primary Examiner*—Paul P. Gordon
*Assistant Examiner*—Emmanuel L. Moise
*Attorney, Agent, or Firm*—Ware, Fressola, Van Der Sluys & Adolphson

[57] ABSTRACT

The error detection and correction device detects and corrects single bit errors in a sequence of bits comprising a plurality of n-bit containing subsets applied on a parallel bus IN having m subset parts. It includes a storage module ST connected to the bus IN and which transfers the subsets as they are received on the bus to a divider logic circuit DL. This circuit performs a m*n bit parallel modulo 2 division of the received sequence by a given polynomial and transfers the remainder REM to a comparison circuit C where it is compared with a zero byte or with an error code byte HEC contained in the sequence depending on the position of the first byte of the sequence on the bus. Based on the result of the comparison and using translation tables a processor circuit PR determines the bit position in the sequence of a bit error. A correction logic CL corrects the received sequence.

9 Claims, 1 Drawing Sheet

ERROR DETECTION AND CORRECTION DEVICE TO DETECT AND CORRECT SINGLE BIT ERRORS IN A TRANSMITTED SEQUENCE OF BITS

CROSS-REFERENCE TO RELATED APPLICATION

This application discloses subject matter that may be disclosed and claimed in copending U.S. patent application Ser. No. 08/091,384 filed on even date herewith.

TECHNICAL FIELD

The present invention relates to an error detection and correction device for detecting and correcting possible erroneous bits in a sequence of bits by performing an error detection algorithm on said sequence.

BACKGROUND OF THE INVENTION

Such devices are widely used in the art. They are based on well known error detection algorithms such as the Cyclic Redundancy Check (CRC) algorithm which detect the bit position of an erroneous bit. Since a bit can only have two values, i.e. 0 or 1, correction of an erroneous bit is obvious when its position is known.

This algorithm and other error check techniques are for example described in chapter 5 of the book "Digital Communications-Fundamentals and Applications" by Bernard Sklar, published by Prentice-Hall International Editions, 1988.

The known devices mostly rely on the fact that the sequence of bits to be processed is received serially or can easily be converted to a serial bit stream.

However, in case of parallel processing of the bits, e.g. on a parallel bus to increase the transmission speed of the bits, their design becomes complicated since application of the algorithm then requires storage and rearrangement of the received bits or of received sets of bits, mostly bytes. The design of these devices becomes even more complicated when the transmitted bits do not use all bit positions on the bus. For example in case of bits transmitted in bytes over a 2 byte bus, a first byte of the sequence can start at a first or a second byte position of the bus. This start position has then to be known by the device in order to know how many bits or bytes have to be processed. Moreover, when the sequence contains an odd number of bytes, this start position alters, thereby additionally complicating the design of the device.

DISCLOSURE OF INVENTION

An object of the invention is to provide an error detection and correction device of the above type but which does not represent the mentioned drawbacks, i.e. which allows parallel processing without rearrangement of the received bits being required.

This object is achieved due to the fact that said sequence comprises a plurality of n-bit containing subsets applied to a parallel bus having m subset parts and that said error detection and correction device includes a detection means to detect to which one of said subset parts a first and a last subset of said sequence is applied, and a processing means to perform said algorithm in steps on sets of m subsets taken from the subsequent subsets of said plurality preceded by p-1 zero subsets and followed by m-q zero subsets if said first subset is applied to a p th one of said subset parts and if said last subset of said sequence is applied to a qth one of said subset parts, p and q being integers greater than zero and not exceeding m.

This means that, the subsets are not rearranged but they are handled in sets of m subsets. The zero subsets are added to solve the problem of a variable number of sets having to be processed when the subset parts are not completely filled. Indeed by adding zero's, the sets always contain m subsets.

The above device is for instance usable in case error detection has to be performed on a 5-byte header of an Asynchronous Transfer Mode (ATM) cell applied on a 2-byte wide parallel bus and having a length of 53 bytes. Indeed, when the data of such a cell is applied to the 2-byte bus bus the position on the bus of the header bytes changes from cell to cell due to the odd number of bytes of the ATM cell, and the first byte of the header is received either on the first or on the second byte part of the bus.

When a received header must be checked for bit errors, for example by means of a CRC algorithm, consecutive bytes thereof have, as mentioned earlier, to be stored and serialized, taking into account the position on the bus of the first byte of the cell header, before applying the algorithm. In other words, the received bytes have to be rearranged taking into account the above position thus complicating the design of a used receiver.

According to the invention, to avoid this complication, the bits are handled as they are received on the bus, i.e. 16 bits or 2 bytes at a time, where zero bits are added when the received header bytes do not completely fill the 2 byte positions of the bus.

A characteristic feature of the error detection and correction device according to the invention is that said error detection algorithm is a cyclic redundancy check algorithm using a polynomial of degree n, said sequence containing an error code, that n equals 8 and that said polynomial is $x^{*}8 + x^{*}2 + x + 1$.

Another characteristic feature of the error detection and correction device according to the invention is that said processing means by applying said algorithm to said sequence obtains a second error code indicative of an erroneous bit position in said sequence and subsequently uses tables to relate said second error code, to said bit position, a first one of said tables, which is used when p exceeds 1 and/or q differs from m, being deduced from a second one of said tables, used when p equals 1 and q equals m, by shifting said bit position in said second table over t bits, t being the result of the operation $(n*(p-1))-(n*(m-q))$ where the sign of said result determines the direction of said shift, and by adding a predetermined number of additional error codes equal to the absolute value of t.

It has indeed been found that the above rabies can be deduced from one start table used when the sequence fills all bus positions, the above addition of zero bits when not all these positions are filled, resulting in a shift of bit error positions and in additional error codes.

Still another characteristic feature of the error detection and correction device according to the invention is that said sequence includes a predetermined maintenance bit sequence the first subset of which is applied to a predetermined one of said subset parts, and that said detection means then includes:

a means to detect said predetermined maintenance bit sequence; and a means to determine to which of said subset parts said first subset of said sequence is applied based on said predetermined part to which a previously received maintenance bit sequence was applied.

Since the position of the maintenance bit sequence on the bus, as well as its length are both known, the position of the first subsets of the following first sequences can be calculated.

Still another characteristic feature of the error detection and correction device according to the invention is that it additionally includes means to correct said erroneous bits based on said bit position.

These and other objects, features and advantages of the present invention will become more apparent in light of the detailed description of a best mode embodiment thereof, as illustrated in the accompanying drawing.

BEST MODE FOR CARRYING OUT THE INVENTION

Figures 1, 2:
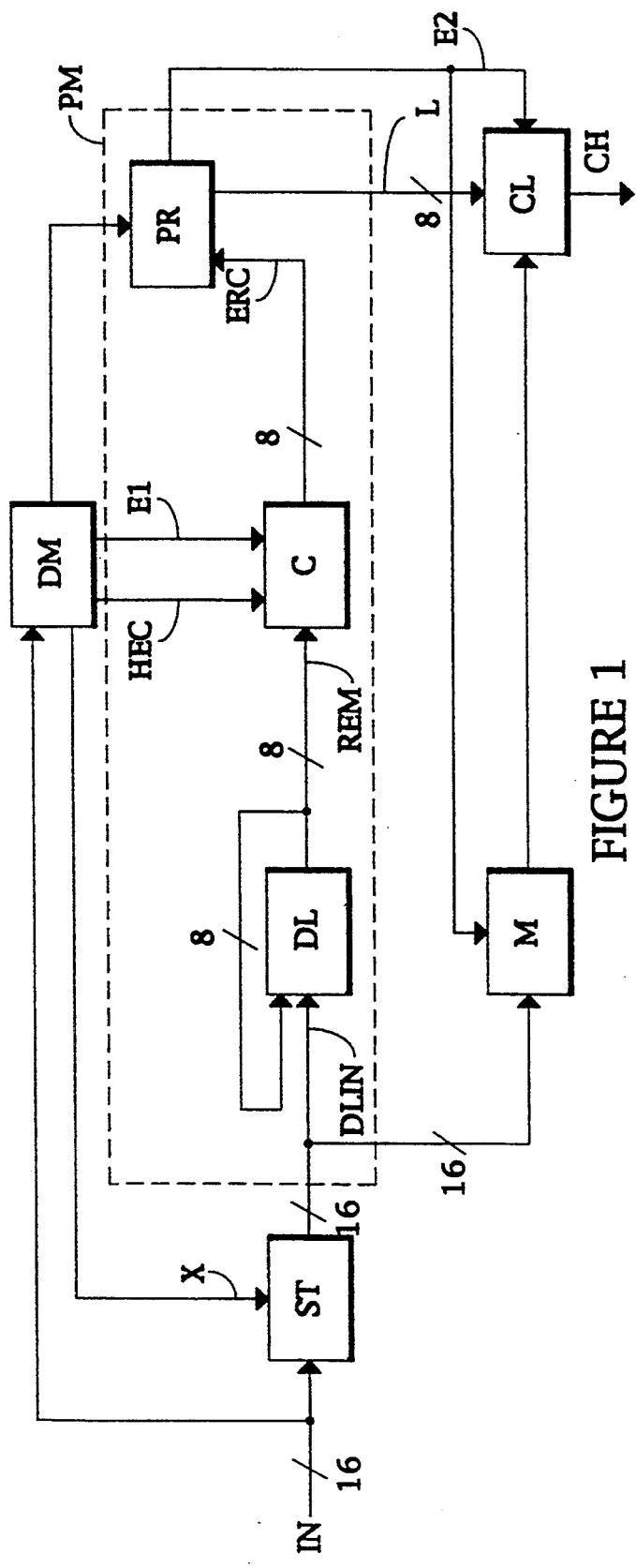
FIG. 1 represents an error detection device according to the invention.
FIG. 2 represents two consecutive bit sequences applied to the bus IN of FIG. 1.

The error detection and correction device represented in FIG. 1 detects and corrects errors occurring in the header of an Asynchronous Transfer Mode (ATM) packet or cell consisting of a 5-byte header part and an 48-byte information part i.e. 53 bytes in total. Each such cell is received on a 2-byte wide parallel transmission bus IN, each byte of the cell being located at either a first or a second byte part of the bus, and when possible in pairs of two bytes.

FIG. 2 shows the consecutive pairs of bytes of two successive such cells received on the bus IN, the bytes being represented by squares. Those of the header are identified by H1 to H4 and HEC, H1 being the first byte of the header part and HEC the last one, and the bytes of the information part are identified by asterisks. Since a complete ATM cell consists of an odd number of bytes, namely 53, H1 is alternately received on the bus at the first and at the second part thereof. When H1 is received at the first byte part, the cell of which it forms part is called an even positioned cell, whereas it is called an odd positioned cell when it is received at the second byte part, as shown in the figure.

The above last header byte HEC is a Header Error Code which, before putting the header on the bus, has been calculated, at a transmitter side (not shown), according to a so-called Cyclic Redundancy Check (CRC) algorithm, i.e. as the remainder of the modulo 2 division of the product (x8 multiplied by the content of the header excluding the HEC) by the so-called generator polynominal $x^{*}8+x^{*}2+x+1$.

The purpose of HEC is to allow the detection and consequently the correction in the header of single bit errors. Multiple bit errors can also be detected but they cannot be corrected. The header bits received on the bus are checked for bit errors in the error detection device of FIG. 1 by recalculating the header error code and comparing the result thereof with the received HEC. The difference modulo 2 of the calculated and the received header error codes is an error code ERC which in case of single bit errors is indicative of the location of those bit errors in the transmitted header, a zero difference indicating there are no such errors. This error code ERC is the so called syndrome of the received error bits. Once, the bit position of an erroneous bit is detected, correction thereof is obvious since a bit can only have two values i.e. 0 or 1.

To be noted that the polynomial $x^{}8+x^{}2+x+1$ is imposed by CCITT for single bit error detection on ATM headers and that the received error code HEC can be included in the division, in which case the result thereof is compared with a zero byte.

To be noted also that the CRC theory is well known in the art and is for instance described in chapter 5 of the above mentioned book, encoding and error detection using binary cyclic-codes being described in sections 5.6.2, 5.6.3 and 5.6.6 thereof.

As shown in FIG. I the error detection and correction device includes a storage module ST the input of which is constituted by the above input bus IN, and the output of which is connected via a 16-wire connection DLIN to a first input of a divider logic circuit DL and to an input of a memory module M. An output of DL is coupled back to a second input thereof as well as via an 8-wire connection REM to an input of a comparison circuit C. C is controlled by an enable signal E1 provided by a decision module DM and its output is connected to a first input of a processor circuit PR. The detection module DM to which the input bus IN is connected generates the signal E1 and a signal HEC which is fed to C, and it controls PR and ST, the latter by means of a signal X, based on the contents of IN. PR generates a signal L which is fed to a correction logic circuit CL via an 8-wire connection L, and it controls CL and M by means of an enable signal E2. H is connected to CL which generates an output signal CH.

DL, C and PR form part of a processing module PM.

It has to be noted that in FIG. 1 the signals shown have the same names as the connections they are provided on, and vice versa. Also, these connections although comprising a number of wires are represented by a single wire with an associated number indicating how may wires the connection includes.

Following is now a description of the operation of the error detection and correction device, by making reference to FIGS. 1 and 2, it being assumed that two types of cells may be received by the device i.e. information cells and maintenance cells, that the first cell received is always a maintenance cell, and that a maintenance cell is received every 27th cell, which means that the position of the first byte of this cell is known. Based on this knowledge the decision module DM receiving the input cell stream from the bus IN predicts which type of information cell will be received, i.e. an even positioned (H1 on first part of the bus) or an odd positioned (H1 on second part) cell, and informs the storage module ST thereof via the control Lead X. By means of this information and when a new cell is received, ST transfers to the divider Logic circuit DL, either the pair of bytes H1 and H2 when the cell is an even positioned one or a zero byte and byte H1 when the cell is an odd positioned one. DL performs a 16-bit parallel modulo 2 division of the received header by the polynomial $X^{}8+X^{}2+X+1$. It therefore divides the 16 bits thus received by the above mentioned polynomial and transfers the remainder REM to the feedback second input of DL as well as to the comparison circuit C.

In the meanwhile ST has passed either the pair of bytes H3 and H4 or the pair of bytes H2 and H3 to DL depending on the cell being an even or an odd positioned one respectively. DL combines the thus received 16-bits with REM and again divides the result by the polynomial, thereby again providing a remainder value REM.

Hereafter it is first supposed that the received cell is an even positioned one.

When after the second division the last mentioned remainder value REM is transferred to C it is compared therein with the header error code HEC of the cell, C being enabled by the signal E1 sent by DM as soon as the latter had detected the end of the header i.e. HEC. This value HEC is extracted from the cell by DM and passed to C. The result of this comparison is the earlier mentioned error code ERC, which in its turn is used in the processing circuit PR to interrogate a translation table (not shown) providing a translation of ERC into a corresponding bit position code L indicative of the position in the header of a corresponding erroneous bit to be corrected. This table will be discussed later on. L is then transferred to the correction logic CL, which in the meanwhile has received the complete header from ST via the memory module M under control of E2. CL corrects the cell header based on the value of L, i.e. it changes the values of the bit on position L from 0 to 1 or vice versa, and generates the corrected header CH. CL is enabled by PR at the moment the latter generates L.

In this way the earlier described algorithm is realized.

It has to be noted that the algorithm could also be realized by adding a zero byte after the header error code HEC as a consequence of which the division requires one additional step, and by comparing the obtained remainder with zero. The earlier mentioned table has then to be adapted accordingly, as will be explained later.

On the contrary, when the cell is an odd positioned cell the above algorithm is slightly adapted.

Indeed, after the earlier mentioned first and second divisions, of O, H1 and H2, H3 respectively the remainder REM is combined in DL with the next two bytes H4 and HEC of the odd positioned cell, and in C the remainder of the third division is compared with O instead of with HEC.

From the above it follows that contrary to what is done for the even positioned cells, for the odd positioned cells the modulo 2 division is applied not to the 4 header bytes, but to the concatenation of a zero byte with the complete header H1, H2, H3, H4, HEC. Additionally the final result of the subsequent divisions is compared with zero instead of with the received value of HEC.

It has been found that by proceeding in this way the bit position of the erroneous bit may also be derived from the code ERC and that more particularly use can be made of an ERC/bit position translation table which differs from the one used for the even positioned cells only in the fact that with respect to the table for the even positioned cells there is a forward shift between the ERC and bit position codes over 8 bits and 8 additional error codes are added which relate to possible errors on the 8 first bits of the header i.e. on bits of H1. For example the same ERC code concerns bit 1 of the even positioned cell and position 9 in case of an odd positioned cell cell.

The table shown on the last page of this description is applicable to the even positioned cells as well as to the odd positioned ones. It is derived from a table, calculated as indicated in the mentioned reference for the even positioned cells, by applying the above mentioned shift and adding the 8 additional codes for the odd positioned cells. The table thus contains for each bit position in the header, the corresponding error code and bit position code or correction code for the even as well as for the odd positioned cells and it can consequently be used to determine L using ERC for the even and for the odd positioned cells. The latter cells can thus be corrected in the same way as the former ones.

It has to be noted that in case the algorithm applied to the even positioned cells is adapted as mentioned earlier to include HEC and a zero byte in the division, the original table for even positioned cells has to be adapted. The bit position codes of the original table have in that case to be shifted backwards over 8 bits and 8 error codes have to be added for the last 8 bit positions.

It can be seen from the table that the bit position codes or correction codes, of the table are directly related to the position of the corresponding erroneous bit on the data bus. Therefore the header is seen as composed of 3 rows of 16 bits as transferred on the bus. The 4 least significant bits of the bit correction codes determine the position of the error bit on the bus or in a row, i.e. it indicates which bit of the above 16 bits on the bus is faulty, 0000 corresponding to the first bit 0, 0001 to the second bit 1, ...., and 1111 to the 16th bit 15. The next two bits of the correction codes together with an odd/even indication received by PR from DM, over the earlier mentioned control lines, indicate in which row the faulty bit is located, where for an even positioned cell 01 indicates the first row being H1, H2; 10 indicates the second row namely H3, H4 and 11 indicates the third row being HEC, 0, whilst for an odd numbered cell 01 indicates the second row H2, H3, 10 indicates the third row H4, HEC and 11 indicates the first row 0, H1.

It has to be noted that the correction code used in the table is a translation of what is, in the earlier mentioned book, called the error pattern or error vector and which corresponds to the address of the single bit error in the header, into the latter address on the parallel bus.

The decision logic DL is a modulo 2 divider which during each clock cycle of a not shown clock controlling the device, divides a block of 16 bits by the given polynomial and which is described in the copending European Patent Application 92202147.2" of even date herewith filed in the European Patent Office on Jul. 14, 1992 entitled "Divider device to divide a first polynomial by a second one" and filed in this country under U.S. Ser. No. 08/091,304 which is hereby incorporated by reference; particular attention is drawn to the sole Figure thereof and the text thereof, beginning at page 4, line 23 and continuing to page 10, line 14. Modules such as M, ST, DM, C, PR and CL are either available on the market, in case of M, or obvious to realize for a person skilled in the art. All these modules are therefore not described in detail.

The above device is applicable to bit sequences received on a two byte wide bus. It is however obvious for a person skilled in the art and based on the above description to extend this device to apply to bit sequences received on a m byte wide bus or even on a parallel bus with m subset parts, where the subsets contain a predetermined number of bits.

While the principles of the invention have been described above in connection with specific apparatus, it is to be clearly understood that this description is made only by way of example and not as a Limitation on the scope of the invention.

| Bit Error | Error code (even case) | Error code (odd case) | Correction code (even case) [Hex] | Correction code (odd case) [Hex] |
|---|---|---|---|---|
| 1 | [8C] | [E9] | 0001 0000 [10] | 0011 1000 [38] |
| 2 | [D9] | [13] | 0001 0001 [11] | 0011 1001 [39] |
| 3 | [73] | [26] | 0001 0010 [12] | 0011 1010 [3A] |
| 4 | [E6] | [4C] | 0001 0011 [13] | 0011 1011 [3B] |
| 5 | [0D] | [98] | 0001 0100 [14] | 0011 1100 [3C] |
| 6 | [1A] | [F1] | 0001 0101 [15] | 0011 1101 [3D] |
| 7 | [34] | [23] | 0001 0110 [16] | 0011 1110 [3E] |
| 8 | [68] | [46] | 0001 0111 [17] | 0011 1111 [3F] |
| 9 | [D0] | [8C] | 0001 1000 [18] | 0001 0000 [10] |
| 10 | [61] | [D9] | 0001 1001 [19] | 0001 0001 [11] |
| 11 | [C2] | [73] | 0001 1010 [1A] | 0001 0010 [12] |
| 12 | [45] | [E6] | 0001 1011 [1B] | 0001 0011 [13] |
| 13 | [8A] | [0D] | 0001 1100 [1C] | 0001 0100 [14] |
| 14 | [D5] | [1A] | 0001 1101 [1D] | 0001 0101 [15] |
| 15 | [6B] | [34] | 0001 1110 [1E] | 0001 0110 [16] |
| 16 | [D6] | [68] | 0001 1111 [1F] | 0001 0111 [17] |
| 17 | [6D] | [D0] | 0010 0000 [20] | 0001 1000 [18] |
| 18 | [DA] | [61] | 0010 0001 [21] | 0001 1001 [19] |
| 19 | [75] | [C2] | 0010 0010 [22] | 0001 1010 [1A] |
| 20 | [EA] | [45] | 0010 0011 [23] | 0001 1011 [1B] |
| 21 | [15] | [8A] | 0010 0100 [24] | 0001 1100 [1C] |
| 22 | [2A] | [D5] | 0010 0101 [25] | 0001 1101 [1D] |
| 23 | [54] | [6B] | 0010 0110 [26] | 0001 1110 [1E] |
| 24 | [A8] | [D6] | 0010 0111 [27] | 0001 1111 [1F] |
| 25 | [91] | [6D] | 0010 1000 [28] | 0010 0000 [20] |
| 26 | [E3] | [DA] | 0010 1001 [29] | 0010 0001 [21] |
| 27 | [07] | [75] | 0010 1010 [2A] | 0010 0010 [22] |
| 28 | [0E] | [EA] | 0010 1011 [2B] | 0010 0011 [23] |
| 29 | [1C] | [15] | 0010 1100 [2C] | 0010 0100 [24] |
| 30 | [38] | [2A] | 0010 1101 [2D] | 0010 0101 [25] |
| 31 | [70] | [54] | 0010 1110 [2E] | 0010 0110 [26] |
| 32 | [E0] | [A8] | 0010 1111 [2F] | 0010 0111 [27] |
| 33 | [01] | [91] | 0011 0000 [30] | 0010 1000 [28] |
| 34 | [02] | [E3] | 0011 0001 [31] | 0010 1001 [29] |
| 35 | [04] | [07] | 0011 0010 [32] | 0010 1010 [2A] |
| 36 | [08] | [0E] | 0011 0011 [33] | 0010 1011 [2B] |
| 37 | [10] | [1C] | 0011 0100 [34] | 0010 1100 [2C] |
| 38 | [20] | [38] | 0011 0101 [35] | 0010 1101 [2D] |
| 39 | [40] | [70] | 0011 0110 [36] | 0010 1110 [2E] |
| 40 | [80] | [E0] | 0011 0111 [37] | 0010 1111 [2F] |

I claim:

1. Error detection and correction device for detecting and correcting possible erroneous bits in a sequence of bits by performing an error detection algorithm on said sequence, wherein said sequence comprises a plurality of n-bit containing subsets applied to a parallel bus having m subset parts and that said error detection and correction device includes a detection means (DM) to detect to which one of said subset parts a first and a last subset of said sequence is applied, and a processing means (PM) to perform said algorithm in steps on sets of m subsets taken from the subsequent subsets of said plurality preceded by p-1 zero subsets and followed by m-q zero subsets if said first subset is applied to a p th one of said subset parts and if said last subset of said sequence is applied to a qth one of said subset parts, p and q being integers greater than zero and not exceeding m.

2. Error detection and correction device according to claim 1, wherein said error detection algorithm is a cyclic redundancy check algorithm using a polynomial of degree n, said sequence containing an error code.

3. Error detection and correction device according to claim 2, wherein n equals 8 and said polynomial is $x^{}8+x^{}2+x+1$.

4. Error detection and correction device according to claim 2, wherein said processing means (PM) by applying said algorithm to said sequence obtains a second error code indicative of an erroneous bit position in said sequence and subsequently uses tables to relate said second error code, to said bit position, a first one of said tables, which is used when p exceeds 1 or q differs from m, or both, being deduced from a second one of said tables, used when p equals 1 and q equals m, by shifting said bit position in said second table over t bits, t being the result of the operation (n*(p-1))-(n*(m-q)) where the sign of said result determines the direction of said shift, and by adding a predetermined number of additional error codes equal to the absolute value of t.

5. Error detection and correction device according to claim 4, further comprising means (M, CL) to correct said erroneous bits based on said erroneous bit position.

6. Error detection and correction device according to claim 2, wherein when said last subset is said error code and q is equal to 1, said sets of m subsets are taken from the subsequent subsets of said plurality without said last subset and preceded by said p-1 zero subsets, said algorithm then being adapted accordingly.

7. Error detection and correction device according to claim 1, wherein said sequence includes a predetermined maintenance bit sequence the first subset of which is applied to a predetermined one of said subset parts, and that said detection means then includes:
   a means to detect a predetermined maintenance bit sequence; and
   a means to determine to which of said subset parts said first subset of said sequence is applied based on said predetermined part to which a previously received maintenance bit sequence was applied.

8. Error detection and correction device according to claim 1, wherein said sequence is the header of an Asynchronous Transmission Mode cell, said subsets being the bytes by which said header is constituted.

9. Error detection and correction device according to claim 1, wherein m equals 2.

* * * * *